United States Patent [19]

Kanbe et al.

[11] Patent Number: 4,472,492
[45] Date of Patent: Sep. 18, 1984

[54] METHOD FOR FABRICATING AND ANNEALING AN ELECTROPHOTOGRAPHIC IMAGE FORMING MEMBER

[75] Inventors: Junichiro Kanbe, Yokohama; Tadaji Fukuda, Kawasaki; Toru Takahashi, Tokyo, all of Japan

[73] Assignee: Canon Kabushiki Kaisha, Tokyo, Japan

[21] Appl. No.: 511,989

[22] Filed: Jul. 8, 1983

Related U.S. Application Data

[63] Continuation of Ser. No. 296,158, Aug. 25, 1981, abandoned.

[30] Foreign Application Priority Data

Sep. 8, 1980 [JP] Japan ................ 55-125124

[51] Int. Cl.³ .......................................... G03G 5/082
[52] U.S. Cl. ................... 430/130; 430/128; 430/133; 430/136; 430/57; 427/39; 204/192 P; 357/2
[58] Field of Search ............ 430/127, 128, 130, 133, 430/135, 136; 427/39; 204/192 P

[56] References Cited

U.S. PATENT DOCUMENTS

| 4,049,461 | 10/1977 | Fan et al. ................ 148/1.5 |
| 4,217,374 | 8/1980 | Ovshinsky et al. ........... 427/39 |
| 4,225,222 | 9/1980 | Kempter ................ 355/3 DR |
| 4,226,898 | 10/1980 | Ovshinsky et al. ....... 430/136 X |
| 4,265,991 | 5/1981 | Hirai ..................... 430/64 |
| 4,289,822 | 9/1981 | Shimada et al. ....... 204/192 P X |

FOREIGN PATENT DOCUMENTS 54-155046 6/1979 Japan ................ 430/130

*Primary Examiner*—Roland E. Martin
*Attorney, Agent, or Firm*—Fitzpatrick, Cella, Harper & Scinto

[57] ABSTRACT

A method for fabricating an electrophotographic image forming member, wherein the first photoconductive layer consisting of an amorphous inorganic semiconductive material is formed on a substrate suited for the electrophotographic process, then the second photoconductive layer, which is different from the first photoconductive layer and consists of amorphous silicon containing therein silicon as the matrix and at least one of hydrogen and halogen atoms, is formed on the first photoconductive layer, and thereafter, the second photoconductive layer is annealed by irradiating a laser beam on the surface of the second photoconductive layer.

24 Claims, 4 Drawing Figures

METHOD FOR FABRICATING AND ANNEALING AN ELECTROPHOTOGRAPHIC IMAGE FORMING MEMBER

This application is a continuation of application Ser. No. 296,158 filed Aug. 25, 1981 abandoned.

BACKGROUND OF THE INVENTION

1. Field of the Invention

This invention relates to an electrophotographic image forming member which is sensitive to electromagnetic waves such as light (in the broad sense of the term, the light includes ultraviolet rays, visible light rays, infrared rays, X-rays, γ-rays, and so on).

2. Description of Prior Arts

The photoconductive material to constitute the photoconductive layer of the electrophotographic image forming member is required to have various characteristics such that it possesses high sensitivity, high resistance, and a spectral characteristic which is as close to a luminosity factor as possible, a high light response speed, a large light absorbing coefficient in a visible light region, a high stability against external influences such as light, heat, etc., and, in addition, it gives no harm at all or the least harm to human body during manufacturing and using.

In particular, the harmlessness to the human body is very important, when the photoconductive material forms an integral part of the electrophotographic image forming member to be used with the electrophotographic apparatus as the office machine.

From such standpoint, amorphous silicon (hereinafter abbreviated as "a-Si") has been considered a promising material in recent years. Various patent specifications and other publications disclose electrophotographic image forming members using the a-Si, e.g., U.S. Pat. No. 4,225,222, U.S. Pat. No. 4,265,991 and Japanese patent publication No. 55-69149. The electrophotographic image forming member disclosed in these publications constitutes its photoconductive layer with a so-called amorphous hydrogenated silicon (hereinafter abbreviated as "a-Si:H") containing therein hydrogen atom, dark resistance and photoconductive characteristics of which are largely governed by the quantity of the hydrogen atom and the method of introducing hydrogen atom into the layer. When the a-Si:H layer having good electrical characteristics and photoconductive characteristics for electrophotography is to be formed with good reproducibility, the layer growth should be made slow, which leaves problems in respect of its productivity in the industrialized mass production. For instance, when fabricating the electrophotographic image forming member having characteristics which are usually required, the growth rate of the a-Si:H layer is approximately 1/100 of that in the case of fabricating a layer of selenium, etc. Considering the charge sustaining capability of electrophotographic image forming members and the developing technique at the present stage, the thickness of the photoconductive layer should be at least 10 microns, which causes difficulty in its industrialized mass production. Moreover, as the a-Si:H layer has a large internal stress, when its layer thickness is made thicker than 10 microns or so, it tends to peel off a substrate or create cracks therein as the case may be, on account of which it is said that the layer having a large area is difficult to be formed.

SUMMARY OF THE INVENTION

The present invention has been made to overcome the above-mentioned various problems.

It is therefore the primary object of the present invention to provide a method for fabricating an electrophotographic image forming member constituted with a-Si, in which the advantageous property of a-Si is made much use of, which is capable of remarkably increasing its productivity in an industrialized mass production scale, and which facilitates manufacturing of the layer having a large area, all these properties being very fascinating from the standpoint of industrialized mass production of the layer.

According to the present invention, in general aspect thereof, there is provided a method for fabricating an electrophotographic image forming member, which comprises steps of: forming a first photoconductive layer composed of an amorphous inorganic semiconductive material on a substrate adapted for use in the electrophotographic process; then forming a second photoconductive layer on said first photoconductive layer, which is different from said first photoconductive layer and is composed of amorphous silicon containing therein silicon atom as the matrix and at least one of halogen and hydrogen atoms [a-Si(H,X), where X is halogen atom], these layers being formed in superposition in the order as mentioned; and finally annealing the second photoconductive layer by irradiating onto the surface of the second photoconductive layer with laser beam.

DESCRIPTION OF THE PREFERRED EMBODIMENT

Figure 1:
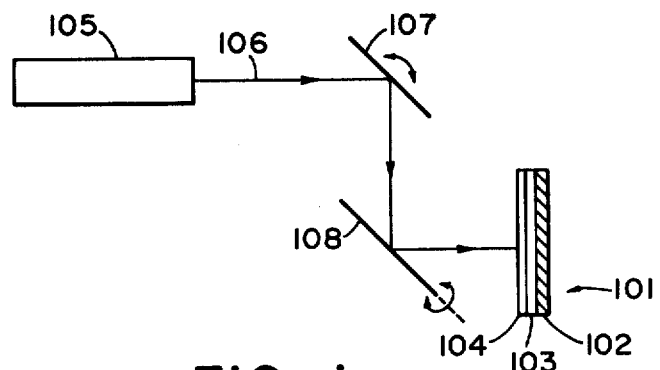
FIG. 1 is a schematic explanatory diagram of a device to practice the method of the present invention.

The electrophotographic image forming member according to the present invention is fabricated by forming on the substrate, which has been pre-treated for the electrophotographic process, the first photoconductive layer composed of an amorphous inorganic semiconductive material having a high rate of deposition by means of the vapor-deposition method, etc., then forming on this first photoconductive layer the second photoconductive layer composed of amorphous silicon [a-Si(H,X)] containing silicon atom as the matrix and at least one of hydrogen and halogen atoms, and thereafter annealing the second photoconductive layer by irradiation of a laser beam onto the surface of the second photoconductive layer.

By thus laminating the second photoconductive layer composed of a-Si(H,X) on the first photoconductive layer, which has been formed on the substrate by using an Se or Se-type amorphous inorganic semiconductive material having a high rate of deposition, as an example, followed by annealing the second photoconductive layer by irradiating the surface of the second photoconductive layer with laser beam, it becomes possible to attai.. remarkable improvement in the charge sustaining capability and the photosensitivity, both of which are important characteristics in the electrophotographic image forming member, as well as considerable increase in efficiency in its production in an industrialized mass production scale.

In the present invention, for the purpose of effectively utilizing the reverse bias effect at the hetero-junction formed by lamination of the first and second photoconductive layers, when a reverse bias voltage is applied to the junction, the conductivity type of each layer is made such that, when the first layer is of n-type, the second layer is rendered p-type, and, when the first layer is of p-type, the second layer is rendered n-type. Needless to say, even a combination of the p-type (or the n-type) and the i-type can make effective use of the reverse bias effect, which may therefore be adopted in the electrophotographic image forming member according to the present invention.

Since the first photoconductive layer according to the present invention is formed of a material having a high rate of deposition, the ratio of its thickness in the total layer thickness of the first and the second photoconductive layers should preferably be as thick as possible within an extent that electrical, photoelectrical, and optical characteristics of the a-Si(H,X) constituting the second photoconductive layer can be utilized at its maximum.

Preferred examples of the amorphous inorganic semiconductive materials constituting the first photoconductive layer according to the present invention are: chalcogen such as Se, Te, S, and the like, amorphous inorganic semiconductive materials consisting of two or more kinds of the chalcogen, and chalcogen materials such as the abovementioned amorphous inorganic semiconductive materials added with As, Ge, Si, and further a very small amount of metals such as Ag, Cu, etc.

For the abovementioned chalcogen compounds, there may be enumerated, for example, $As_2Se_3$, $As_2Se_3$ containing therein 0.2% or so of Ag, $As_2S_3$, $As_2S_3$ containing therein 0.2% or so of Ag, $AsSe_{19}$, $Se_{19}S$, $Se_{99}Ge$, $Se_9Te$, $AsSe_9$, $As_2Se_2Te$, and the like.

According to the present invention, the second photoconductive layer can be formed with a-Si(H,X) in the following three conductivity types.

(1) n-type: This type of the layer contains donor alone, or both donor and acceptor with the donor concentration (Nd) being higher than the acceptor.
(2) p-type: This type of the layer contains acceptor alone, or both donor and acceptor with the acceptor concentration (Na) being higher than the donor.
(3) i-type: This type of the layer has a relationship of the donor and acceptor concentration of $Na \approx Nd \approx 0$ or $Na \approx Nd$.

Halogen atom (X) to be contained in the second photoconductive layer may be fluorine, chlorine, bromine, and iodine, of which fluorine and chlorine are particularly preferable.

The second photoconductive layer composed of a-Si(H,X) can be formed by various deposition layer forming methods which are usually adopted in forming the a-Si layer such as, for example, glow discharge methods (GD method), sputtering methods (SP method), ion-plating methods (IP method), and other vapor-deposition methods utilizing the discharge phenomenon, as well as ion-implantation method, and so forth.

In order to form the second photoconductive layer by the glow discharge method, for example, it may suffice that a raw material gas for feeding silicon which is a feeding source of silicon atom (Si) and another raw material gas for introducing halogen atom, or hydrogen atom, or both are fed into a deposition chamber, the internal pressure of which is reducible, then glow discharge is effected within the deposition chamber to form a layer composed of a-Si(H,X) on the surface of the substrate placed at a predetermined position in the deposition chamber.

In case the amorphous layer is to be formed by the sputtering method, it may suffice that, when a target made of silicon is used for sputtering in an atmosphere of an inert gas such as, for example, argon, helium, and the like or a mixture gas with these inert gases as the basic component, a raw material gas for introducing hydrogen atom, or halogen atom, or both be introduced into the deposition chamber.

Effective raw material gases for feeding silicon used upon formation of the second photoconductive layer according to the present invention, are silicon halides (silanes) in a gaseous or gasifiable state such as $SiH_4$, $Si_2H_6$, $Si_3H_8$, $Si_4H_{10}$, and the like. From the standpoint of readiness in handling at the layer forming process and of silicon feeding efficiency, $SiH_4$ and $Si_2H_6$ are particularly favorable.

Effective raw material gases for introducing halogen atom used at the formation of the second photoconductive layer according to the present invention are various halogen compounds such as halogen gases, halides, inter-halogen compounds, halogen-substituted silane derivatives (halogenated silanes), and other halogen compounds in a gaseous or gasifiable state.

Further, gaseous or gasifiable halogen-containing silicon compounds with silicon atom and halogen atom as the constituent elements can also be used effectively for the purpose of the present invention.

Preferable halogen compounds used in the present invention are halogen gases such as fluorine, chlorine, bromine, and iodine, and inter-halogen compounds such as BrF, ClF, $ClF_3$, $BrF_5$, $BrF_3$, $IF_7$, $IF_5$, ICl, IBr, and the like.

As the halogen-containing silicon compounds, i.e., the so-called halogen-substituted silane derivatives, there may be enumerated halogenated silanes such as $SiF_4$, $Si_2F_6$, $SiCl_4$, $SiBr_4$ and the like.

When the second photoconductive layer is formed by a glow discharge method using such halogen-containing silicon compounds, the second photoconductive layer composed of a-Si:X can be formed on a predetermined substrate without use of the silicon hydride gas as the raw material gas capable of feeding silicon atom.

In case the second photoconductive layer containing halogen atom is fabricated in accordance with the glow discharged method, it may suffice fundamentally that a silicon halide gas which is a raw material gas for feeding silicon and a gas such as argon, helium, hydrogen, and the like are mixed at a predetermined mixing ratio and fed at a predetermined gas flow rate into the deposition chamber where the second photoconductive layer is to be formed, and then glow discharge is effected to produce a plasma atmosphere of these gases within the deposition chamber, thereby forming the second photoconductive layer on a predetermined substrate. In this instance, a predetermined quantity of hydrogen-containing silicon compound may be further mixed with these gases for promoting introduction of hydrogen atom thereinto for the layer formation. It is also feasible that each of the gases be used not only in its single kind, but also in mixture of a plurality of kinds of gases at a predetermined mixing ratio.

In order to form the second photoconductive layer composed of a-Si(H,X) on the first photoconductive layer by a reactive sputtering method or an ion-plating method, the following process can be adopted. In the case of the sputtering method, a target made of silicon is sputtered in a predetermined gas plasm atmosphere. In the case of the ion-plating method, a polycrystalline silicon or a mono-crystalline silicon is placed in an evaporating boat as a source of the vapor-deposition, the silicon source being evaporated under heat by the resistive heating method or electron beam method (EB method) to cause the evaporated and sputtering substance to pass through the predetermined gas plasm atmosphere. At this instant, for the halogen atom to be introduced into the layer formed by either method of sputtering and ion-plating, the abovementioned halides or halogen-containing silicon compounds in a gaseous state may be introduced into the deposition chamber to form the plasma atmosphere of the gas.

When hydrogen atom is introduced into the layer to be formed, the raw material gas for introducing hydrogen atom, e.g., hydrogen, silanes, etc., may be introduced into the sputtering deposition chamber to form the plasma atmosphere of the gas.

In the present invention, the abovementioned halogen compounds or halogen-containing silicon compounds are used as an effective raw material gas for introducing halogen atom to be used at the time of forming the second photoconductive layer. Besides these, there may be enumerated, as the starting material for forming the second photoconductive layer, hydrogen halides such as HF, HCl, HBr, HI, etc., halogen-substituted silicon hydrides such as $SiH_2F_2$, $SiH_2Cl_2$, $SiHCl_3$, $SiH_2Br_2$, $SiHBr_3$, and the like, and various other halides in a gaseous or gasifiable state with hydrogen atom as one of the constituent elements.

The hydrogen-containing halides are capable of introducing into the second photoconductive layer at the time of its formation not only the halogen atom, but also the hydrogen atom which is extremely effective for controlling the electric or photoelectric characteristics of the layer, hence such halides are used as the preferred halogen-introducing raw material for the purpose of the present invention.

Besides the above, in order to structurally introduce hydrogen atom into the second photoconductive layer, it is also feasible that electric discharge be generated within the deposition chamber in the co-presence of hydrogen or silicon hydrides gas such as $SiH_4$, $Si_2H_6$, $Si_3H_8$, $Si_4H_{10}$, and the like and a silicon compound for introducing silicon into the layer.

For example, in the case of the reactive sputtering method, a silicon target is used, and a halogen atom introducing gas and hydrogen gas are introduced into the deposition chamber together with an inert gas such as helium, argon, and the like, depending on necessity, to thereby form a plasma atmosphere. Thereafter, the silicon target is subjected to the sputtering to form the second photoconductive layer composed of a-Si(H,X) having a predetermined characteristics. Furthermore, those gases such as $B_2H_6$, $PH_3$, $PF_3$, and the like may be introduced for the purpose of also serving as a doping impurity.

In the present invention, the quantity of hydrogen atom, or halogen atom, or hydrogen and halogen atoms to be contained in the second photoconductive layer of the electrophotographic image forming member should be usually in a range of from 1 to 40 atomic %, preferably from 5 to 30 atomic %.

In order to control the quantity of hydrogen atom, or halogen atom, or both to be contained in the layer, it may suffice to control the temperature of the substrate, or quantity of introduction into the deposition apparatus of the starting material to be used for introducing hydrogen into the resulting layer, or discharging power, or combinations of these parameters.

In order that the conductivity type of the second photoconductive layer may be rendered n-type, or p-type, or i-type, an n-type impurity or a p-type impurity or both are doped into the layer at its formation by glow discharge methods, reactive sputtering methods, and so on, while controlling the quantity.

For the impurities to be added to the second photoconductive layer, there may be enumerated Group III-A elements of the Periodic Table, such as B, Al, Ga, In, Tl, and the like to render the layer the p-type conductivity, and the Group V-A elements of the Periodic Table such as N, P, As, Sb, Bi, and the like to render it the n-type conductivity.

Quantity of the impurity to be added to the layers may be arbitrarily determined in conformity to desired electrical, optical, and photoelectrical characteristics of the layer. In the case of Group III-A elements, an amount of from $10^{-6}$ to $10^{-3}$ atomic ratio with respect to one silicon atom which is the matrix constituent atom is usually desirable, or, more preferably from $10^{-5}$ to $10^{-4}$ atomic ratio. In the case of Group V-A elements, an amount of from $10^{-8}$ to $10^{-3}$ atomic ratio with respect to one silicon atom is usually desirable, or, more preferably from $10^{-8}$ to $10^{-4}$ atomic ratio.

According to the present invention, it is preferable that the second photoconductive layer be annealed at a temperature higher than the crystallizing temperature of the material constituting the first photoconductive layer to result in an excellent annealing effect.

Therefore, a contrivance is made at the time of irradiating a laser beam onto the surface of the second photoconductive layer with a laser beam for its annealing so that the first photoconductive layer may not be crystallized. That is to say, the irradiating time, intensity, and irradiating method of the laser beam are appropriately determined in accordance with various factors so that the temperature at a surface portion of the second photoconductive layer irradiated with the laser beam may not abruptly rise up, and such temperature rise may not accelerate crystallization of the first photoconductive layer.

The laser beam for irradiation is selected from those wavelength regions, the absorption coefficient of which is sufficiently large at the second layer so that it may not pass through the second layer to irradiate directly the first layer to heat the first layer to a temperature higher than its crystallizing temperature.

The laser beams which are considered to have a large absorption coefficient as to the a-Si(H,X) are, for example, argon laser, ruby laser, and so on.

The conditions for the laser beam irradiation may be arbitrarily determined in accordance with the thickness of the second photoconductive layer. It is preferred that the laser beam is at 1 watt or higher in output, is converged with a beam diameter of 50 microns or less, and irradiated with a scanning speed of 1 to 100 cm/sec. or so.

When the surface of the second photoconductive layer is irradiated with a laser beam under the conditions as mentioned above, the temperature distribution on the second photoconductive layer is such that only the portion where the laser beam is projected is at a high temperature, while the surface region of the second photoconductive layer adjacent to the beam irradiated surface portion is close to a normal temperature, because the laser beam irradiating time on the specific location is extremely short. Therefore, the heat diffusion occurs in the direction of the layer surface, whereby the constituent substance of the first photoconductive layer can be free from undesirable heating and modification.

Thickness of the first photoconductive layer usually ranges from 10 to 100 microns, preferably from 20 to 80 microns.

Thickness of the second photoconductive layer usually ranges from 0.2 to 10 microns, preferably from 0.2 to 3 microns in the case of argon laser, and from 5 to 10 microns in the case of ruby laser.

FIG. 1 schematically shows one example of a device for annealing the surface of the electrophotographic image forming member 101, which has been fabricated in accordance with the present invention, by irradiation of the laser beam. The electrophotographic image forming member 101 is fabricated by a commonly adopted method, wherein the first photoconductive layer 103 and the second photoconductive layer 104 are formed on the substrate 102 which has been pre-treated for the electrophotographic process, after which the image forming member is set at a position where it is subjected to annealing process. In order that the surface of the second photoconductive layer 104 may be scanned by the laser beam as intended, the irradiating direction of the laser beam 106 oscillated from a laser beam oscillating source 105 is deflected by an X-axis mirror 107 and a Y-axis mirror 108 to thereby scan the entire surface region of the second photoconductive layer 104 with the laser beam, whereby the second photoconductive layer 104 is annealed.

The laser scanning method as shown in FIG. 1 stands for the CW laser scanning method. Besides this, the Q-switch-pulse method can also be adopted.

EXAMPLE 1

Figure 2:
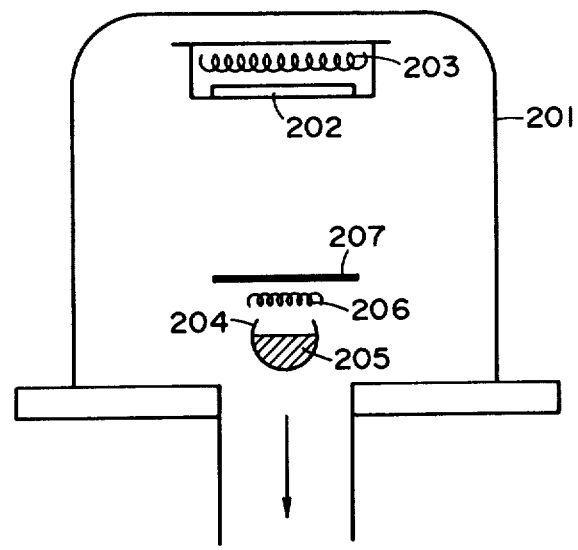
FIG. 2 is a schematic diagram showing one embodiment of a vapor-deposition apparatus to form the first photoconductive layer according to the present invention.

FIG. 2 is a schematic diagram showing one embodiment of a vapor-deposition apparatus to form the first photoconductive layer. The aluminum substrate 202 placed in the upper part of the vacuum chamber 201 is heated by the heater 203. The vapor-deposition material 205 placed in the vaporization boat 204 is an amorphous Se containing therein 5 wt. % of Te. The vapor-deposition material is heated by the tungsten heater 206, evaporated, and deposited on the substrate 202, whereby the first photoconductive layer is formed.

Figure 3:
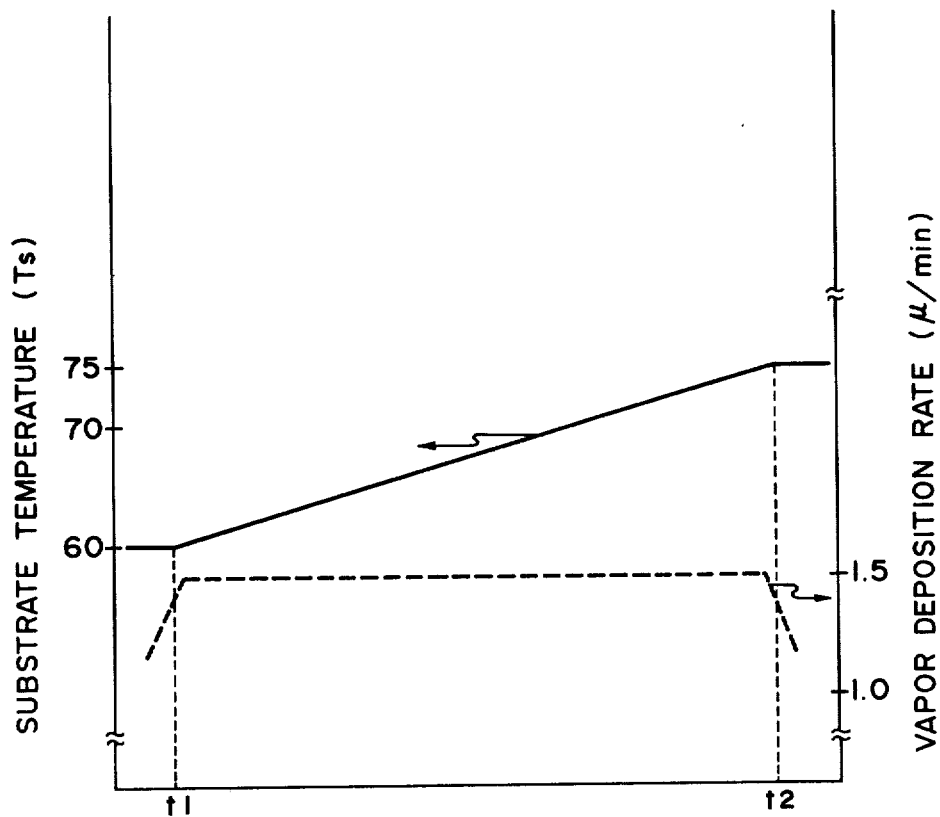
FIG. 3 is a graphical representation showing a relationship among a vapor-deposition time, a substrate temperature $T_s$, and a rate of the vapor-deposition.
Figure 4:
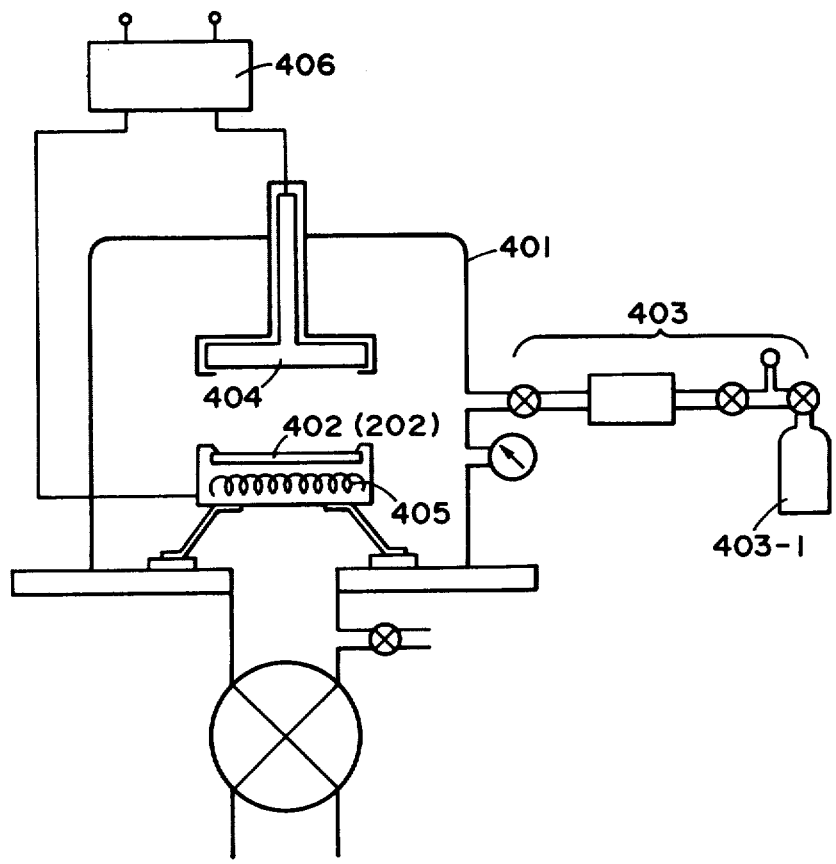
FIG. 4 is a schematic diagram showing one embodiment of a plasma reaction apparatus to form the second photoconductive layer according to the present invention.

The conditions for the vapor-deposition are shown in FIG. 3. In the graphical representation, the abscissa denotes time. During a time period of from $t_1$ to $t_2$, the shutter 207 is opened. The ordinate represents both temperature $T_s$ of the substrate 202 and vapor-deposition rate. The substrate 202 is maintained at its temperature $T_s$ of 60° C. when the shutter 207 is opened ($t_1$). The temperature rise is so controlled that it may be elevated linearly. The temperature $T_s$ of the substrate when the shutter 207 is closed ($t_2$) is 75° C., at which the vapor-deposition terminates. The rate of deposition during the vapor deposition operation is 1.5 microns/min., and thickness of the resulting layer is 60 microns. The power source for the heater 203 for the substrate is then turned off. As soon as the substrate temperature lowers to a room temperature, the substrate 202, on which the first photoconductive layer has been formed, is taken out of the chamber. Subsequently, the substrate with the first photoconductive layer having been formed thereon is placed in the plasma reaction apparatus as shown in FIG. 4. The substrate here is designated by a reference numeral 402. In the drawing, a numeral 401 refers to a pressure-reducible reaction chamber; a numeral 403 refers to a gas feeding system, in which a bomb 403-1 contains therein a raw material gas composed of $SiH_4$ gas diluted with $H_2$ to a concentration of 50%; a numeral 404 refers to an electrode opposed to the substrate 402, to which a high frequency power of 13.6 MHz is applied from the power source 406, whereby the raw material gas introduced into the reaction chamber 401 is decomposed and the decomposed substance is deposited on the substrate 402; and a reference numeral 405 designates a heater for the substrate, by which the substrate 402 is maintained at a temperature of approximately 50° C. The raw material gas is supplied under the abovementioned conditions and decomposed with a discharge power of 30 W, whereby the second photoconductive layer consisting of amorphous silicon layer is formed to a thickness of approximately 1 micron.

Subsequently, the substrate with the first and second photoconductive layers having been formed thereon is taken out of the reaction chamber, and placed in the laser scanning annealing apparatus as schematically shown in FIG. 1, as is the case with the substrate 101. The surface of the second photoconductive layer is scanned with the argon laser 105 of an output of 10 W at a scanning speed of 10 cm/sec.

The thus obtained electrophotographic image forming member is placed in a charge-exposure test apparatus to subject it to a corona charging for 0.2 second at (+) 6 kV immediately followed by light image irradiation. The light image irradiation is done by using a tungsten lamp as a light source with appropriate exposure quantity of 1.0 lux. sec.

Immediately after this light image irradiation, a negatively charged developer (containing a toner and a carrier) is spread in cascade on the surface of the image forming member to thereby obtain a favorable toner image on it. When the toner image on the image forming member is transferred onto an image transfer paper with corona charging of (+) 5.5 kV, there can be obtained a clear transfer image of high image density and good reproducibility in its gradation.

EXAMPLE 2

In the substantially same layer forming procedures as in Example 1 above, the electrophotographic image forming members (Specimen Nos. 1 to 4) are fabricated under the layer forming conditions as well as the annealing conditions being as shown in Table 1 below.

These electrophotographic image forming members are then subjected to continuous operation for toner transfer image formation over a long period of time in accordance with the substantially same procedures as in Example 1 above. Extremely fine quality of the transfer image can be obtained on all the electrophotographic image forming members from the initial sheet to the last one.

TABLE 1

| Specimen No. | Substrate | First Photoconductive Layer | | Second Photoconductive Layer | | Annealing Conditions |
|---|---|---|---|---|---|---|
| | | Layer Forming Raw Material | Layer Forming Conditions | Layer Forming Raw Material | Layer Forming Conditions | |
| 1 | aluminum | SeTe (Te 5% by weight) | vacuum deposition method (layer thickness of 60μ) substrate temp. 60° C.→75° C. | $SiH_4 + SiF_4 + H_2$ ($SiF_4/SiH_4 = 0.3$; $SiF_4 + SiH_4/H_2 = 1$) | glow discharge decomposition method (layer thickness of 1μ) substrate temp. 50° C. | Ar laser output 10W; scanning speed 10 cm/sec. |
| 2 | aluminum | Se | vacuum deposition method (layer thickness of 55μ) substrate temp. 55° C.→70° C. | $SiH_4 + H_2$ ($SiH_4/H_2 = 0.1$) | glow discharge decomposition method (layer thickness of 1.5μ) substrate temp. 50° C. | Ar laser output 13W; scanning speed 20 cm/sec. |
| 3 | aluminum | $As_2Se_3$ | vacuum deposition method (layer thickness of 70μ) substrate temp. 180° C.→195° C. | $SiH_4 + SiF_4 + H_2$ ($SiF_4/SiH_4 = 0.3$; $SiF_4 + SiH_4/H_2 = 1$) | glow discharge decomposition method (layer thickness of 1μ) substrate temp. 150° C. | Ar laser output 10W; scanning speed 10 cm/sec. |
| 4 | aluminum | Se | vacuum deposition method (layer thickness of 55μ) substrate temp. 55° C.→70° C. | $Si_2H_6 + H_2$ ($Si_2H_6/H_2 = 0.8$) | glow discharge decomposition method (layer thickness of 1.5μ) substrate temp. 50° C. | Ar laser output 13W; scanning speed 50 cm/sec. |

We claim:

1. A method for fabricating an electrophotographic image forming member, which comprises steps of:
   (a) forming a first photoconductive layer by vacuum-deposition, on a substrate suited for electrophotographic process, of an amorphous inorganic semiconductive material containing therein, as a constituent element, at least one element selected from the group consisting of Se, Te, and S;
   (b) subsequently forming a second photoconductive layer on the surface of said first photoconductive layer by electric discharge decomposition of a raw material gas for forming an amorphous silicon, said raw material gas containing silicon atom as the matrix and at least one of hydrogen and halogen atoms; and
   (c) annealing said second photoconductive layer at a temperature above the crystallization temperature of said first photoconductive layer by irradiating said second photoconductive layer with a laser beam from the free surface side thereof under conditions sufficient to prevent said first photoconductive layer from reaching its crystallization temperature and for maintaining the second photoconductive layer in the amorphous state.

2. The method as set forth in claim 1, wherein said raw material gas is at least one selected from the group consisting of silicon hydrides, silicon halides, and halogen-substituted silicon hydrides.

3. The method as set forth in claim 2, wherein said silicon hydride is one selected from the group consisting of $SiH_4$, $Si_2H_6$, $Si_3H_8$, and $Si_4H_{10}$.

4. The method as set forth in claim 2, wherein said silicon halide is one selected from the group consisting of $SiF_4$, $Si_2F_6$, $SiCl_4$, and $SiBr_4$.

5. The method as set forth in claim 2, wherein said halogen-substituted silicon hydride is one selected from the group consisting of $SiH_2F_2$, $SiH_2Cl_2$, $SiHCl_3$, $SiH_2Br_2$, and $SiHBr_3$.

6. The method as set forth in claim 1, wherein said electric discharge is a glow discharge.

7. The method as set forth in claim 1, wherein said annealing step of said second photoconductive layer by the laser beam is effected at a temperature higher than the crystallizing temperature of said first photoconductive layer by establishing values of a laser beam intensity and an irradiating time thereof in such a manner not to cause said first photoconductive layer to reach its crystallizing temperature when said second photoconductive layer is annealed.

8. A method for fabricating an electrophotographic image forming member, which comprises steps of:
   (a) forming a first photoconductive layer composed of an amorphous inorganic semiconductive material on a substrate suited for the electrophotographic process;
   (b) forming a second photoconductive layer on said first photoconductive layer, which is different from said first photoconductive layer and is composed of amorphous silicon containing silicon atom as the matrix and at least one of halogen and hydrogen atoms; and
   (c) annealing said second photoconductive layer at a temperature above the crystallization temperature of said first photoconductive layer by projecting a laser beam onto the surface of said second photoconductive layer under conditions sufficient to prevent said first photoconductive layer from reaching its crystallization temperature and for maintaining the second photoconductive layer in the amorphous state.

9. The method as set forth in claim 8, wherein said amorphous inorganic semiconductive material is at least one selected from the group consisting of Se, Te, and S.

10. The method as set forth in claim 8, wherein said second photoconductive layer contains 1 to 40 atomic % of hydrogen atom.

11. The method as set forth in claim 8, wherein said second photoconductive layer contains 1 to 40 atomic % of halogen atom.

12. The method as set forth in claim 11, wherein said halogen atom is one selected from the group consisting of fluorine, chlorine, bromine, and iodine.

13. A method for fabricating an electrophotographic image forming member, which comprises steps of:
   (a) forming a first photoconductive layer consisting of an amorphous inorganic semiconductive material on a substrate suited for the electrophotographic process;
   (b) forming a second photoconductive layer on said first photoconductive layer, which is different from said first photoconductive layer and is composed of amorphous silicon containing silicon atom as the matrix and at least one of hydrogen and halogen atoms; and
   (c) thereafter, annealing said second photoconductive layer at a temperature above the crystallizing temperature of said first photoconductive layer by irradiating the surface of said second photoconductive layer with a laser beam, the intensity and the irradiating time of which have been so set that said first photoconductive layer may not attain its crystallizing temperature and for maintaining the second photoconductive layer in the amorphous state.

14. The method as set forth in claim 13, wherein said raw material gas is at least one selected from the group consisting of silicon hydrides, silicon halides, and halogen-substituted silicon hydrides.

15. The method as set forth in claim 14, wherein said silicon hydride is one selected from the group consisting of $SiH_4$, $Si_2H_6$, $Si_3H_8$, and $Si_4H_{10}$.

16. The method as set forth in claim 14, wherein said silicon halide is one selected from the group consisting of $SiF_4$, $Si_2F_6$, $SiCl_4$, and $SiBr_4$.

17. The method as set forth in claim 14, wherein said halogen-substituted silicon hydride is one selected from the group consisting of $SiH_2F_2$, $SiH_2Cl_2$, $SiHCl_3$, $SiH_2Br_2$, and $SiHBr_3$.

18. The method as set forth in claim 13, wherein said electric discharge is a glow discharge.

19. A method for fabricating an electrophotographic image forming member, which comprises steps of:
   (a) forming a first photoconductive layer composed of an amorphous inorganic semiconductive material on a substrate suited for the electrophotographic process to a thickness of from 10 to 100μ;
   (b) forming a second photoconductive layer on said first photoconductive layer to a thickness of from 0.2 to 10μ, said second photoconductive layer being different from said first photoconductive layer and composed of amorphous silicon containing silicon atom as the matrix and at least one of hydrogen and halogen atoms; and
   (c) thereafter, annealing said second photoconductive layer at a temperature above the crystallizing temperature of said first photoconductive layer by irradiating the surface of said second photoconductive layer with a laser beam, the intensity and the irradiating time of which have been so set that said first photoconductive layer may not attain its crystallizing temperature and for maintaining the second photoconductive layer in the amorphous state.

20. The method as set forth in claim 19, wherein said raw material gas is at least one selected from the group consisting of silicon hydride, silicon halides, and halogen-substituted silicon hydrides.

21. The method as set forth in claim 19, wherein said silicon hydride is one selected from the group consisting of $SiH_4$, $Si_2H_6$, $Si_3H_8$, and $Si_4H_{10}$.

22. The method as set forth in claim 19, wherein said silicon halide is one selected from the group consisting of $SiF_4$, $Si_2F_6$, $SiCl_4$, and $SiBr_4$.

23. The method as set forth in claim 19, wherein said halogen-substituted silicon hydride is one selected from the group consisting of $SiH_2F_2$, $SiH_2Cl_2$, $SiHCl_3$, $SiH_2Br_2$, and $SiHBr_3$.

24. The method as set forth in claim 19, wherein said electric discharge is a glow discharge.

* * * * *